(12) United States Patent
Milner et al.

(10) Patent No.: US 9,331,712 B1
(45) Date of Patent: May 3, 2016

(54) COMPRESSED CACHING IN A VIRTUAL MEMORY SYSTEM

(71) Applicant: QUALCOMM INCORPORATED, San Diego, CA (US)

(72) Inventors: Adrienne Milner, San Diego, CA (US); Amin Ansari, San Diego, CA (US); Richard Senior, San Diego, CA (US); Vito Remo Bica, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/832,732

(22) Filed: Aug. 21, 2015

Related U.S. Application Data

(60) Provisional application No. 62/159,871, filed on May 11, 2015, provisional application No. 62/192,136, filed on Jul. 14, 2015.

(51) Int. Cl.
  *H03M 5/00* (2006.01)
  *H03M 7/40* (2006.01)
  *H03M 7/48* (2006.01)

(52) U.S. Cl.
  CPC .............. *H03M 7/4062* (2013.01); *H03M 7/48* (2013.01)

(58) Field of Classification Search
  CPC ....... H03M 7/48; H03M 7/4062; G06F 12/08; G06F 12/0802
  USPC ................. 341/50–90; 711/164, 165
  See application file for complete search history.

(56) References Cited

U.S. PATENT DOCUMENTS

| | | | | |
|---|---|---|---|---|
| 4,626,829 A * | 12/1986 | Hauck ..................... | G06T 9/005 | 341/106 |
| 5,231,485 A * | 7/1993 | Israelsen ................. | G06T 9/008 | 341/67 |
| 5,247,357 A * | 9/1993 | Israelsen ............. | H03M 7/3082 | 341/106 |
| 5,255,090 A * | 10/1993 | Israelsen ................. | G06T 9/008 | 341/67 |
| 5,300,931 A * | 4/1994 | Lindsay .............. | H03M 7/3082 | 341/106 |
| 5,703,581 A * | 12/1997 | Matias .................... | G06T 9/005 | 341/67 |
| 5,973,626 A * | 10/1999 | Berger .................... | H03M 7/42 | 341/106 |
| 7,079,056 B2 * | 7/2006 | Weaver ................... | H03M 7/46 | 341/106 |
| 7,129,864 B2 | 10/2006 | Jahanghir et al. | | |
| 7,348,901 B2 | 3/2008 | De Martin et al. | | |
| 7,403,136 B2 * | 7/2008 | De La Cruz ........ | H03M 7/3084 | 341/106 |
| 8,400,335 B2 | 3/2013 | Jaquette | | |
| 8,643,515 B2 | 2/2014 | Cideciyan | | |
| 8,692,696 B2 | 4/2014 | Cideciyan et al. | | |
| 8,947,513 B2 * | 2/2015 | Ganick ................ | G01C 21/206 | 348/61 |
| 2003/0137438 A1 * | 7/2003 | Yokose ................... | H03M 7/48 | 341/106 |
| 2010/0149004 A1 * | 6/2010 | Radhakrishnan ....... | H03M 7/40 | 341/67 |
| 2011/0206132 A1 | 8/2011 | Bivolarsky et al. | | |

\* cited by examiner

*Primary Examiner* — Lam T Mai
(74) *Attorney, Agent, or Firm* — Smith Tempel

(57) ABSTRACT

Data compression systems, methods, and computer program products are disclosed. For each successive input word of an input stream, it is determined whether the input word matches an entry in a lookback table. The lookback table is updated in response to the input word. Input words may be of a number of data types, including zero runs and full or partial matches with an entry in the lookback table. A codeword is generated by entropy encoding a data type corresponding to the input word. The lookback table may be indexed by the position of the input word in the input stream.

30 Claims, 6 Drawing Sheets

US 9,331,712 B1

COMPRESSED CACHING IN A VIRTUAL MEMORY SYSTEM

CROSS-REFERENCE TO RELATED APPLICATIONS

The benefit of U.S. Provisional Patent Application No. 62/159,871, filed May 11, 2015, entitled "IMPROVED COMPRESSED CACHING IN A VIRTUAL MEMORY SYSTEM," and U.S. Provisional Patent Application No. 62/192,136, filed Jul. 14, 2015, entitled "IMPROVED COMPRESSED CACHING IN A VIRTUAL MEMORY SYSTEM," are hereby claimed, and the specifications thereof are incorporated herein in their entirety by this reference.

DESCRIPTION OF THE RELATED ART

A computing device, such as a desktop, laptop or tablet computer, smartphone, portable digiti assistant, portable game console, etc., includes one or more processors, such as central processing units, graphics processing units, digital signal processors, etc., and one or more memories. Other electronic devices, such as computer peripheral devices, as well as consumer electronics devices that have not traditionally been referred to as computing devices, may also include one or more processors and memories.

Some types of devices, such as portable devices, may have limited amount of physical system memory (storage) capacity in relation to the amount needed by a processor. Techniques commonly known as virtual memory and paging may be employed to address the problem of limited physical system memory. Virtual memory refers to the mapping of a larger "virtual" address space accessible by a processor to a smaller physical address space in which a system memory, such as dynamic random access memory ("DRAM"), operates. Paging has traditionally referred to the technique of transferring information between the system memory and non-volatile storage or other secondary storage, such as a disk drive or FLASH memory. Pages to which the processor does not need immediate access are evicted from system memory into secondary storage. In portable devices or other devices having limited amounts of secondary storage or in which access to secondary storage comes at the cost of increased latency, paging has evolved to include storing evicted pages in compressed form in the system memory instead of storing evicted pages in secondary storage. This technique may be referred to as compressed caching.

Several compressed caching methods are known, including LZ and WKDM. In the WKDM method, successive input words in a page are processed by maintaining a lookback table of the last 16 unique input words encountered and generating a tag or codeword that classifies each input word. There are just four codewords, which thus can be represented by two bits: a first codeword (e.g., "00") to indicate that the input word is all zeros; a second codeword (e.g., "01") to indicate that the input word fully matches one of the 16 entries in the lookback table; a third codeword (e.g., "10") to indicate that the input word only partially (i.e., only the most-significant bits) matches one of the entries in the lookback table; and a fourth codeword (e.g., "11") to indicate that the input word does not match any of the entries in the lookback table. The compressed output comprises: the codewords; a table of indices relating those codewords indicating full-word matches to the matching entries in the lookback table; input words that do not fully match any entry in the lookback table; and the non-matching portions (i.e., least-significant bits) of input words that partially match entries in the lookback table. A hash function is employed on the input words to provide efficient indexing into the lookback table.

SUMMARY OF THE DISCLOSURE

Systems, methods, and computer programs are disclosed for compressing and decompressing data streams.

In an exemplary method for compressing an input stream, for each successive input word of the input stream, it is determined whether the input word matches an entry in a lookback table. The lookback table is updated in response to the input word. A codeword is generated by entropy encoding a data type corresponding to the input word. Input words may be of a plurality of data types. The data types include at least a first data type that indicates full matching between the input word and an entry in the lookback table and a second data type that indicates partial matching between the input word and an entry in the lookback table. An output stream that includes the codewords is generated.

An exemplary system for compressing an input stream includes a memory and a processor. The processor is configured to read successive input words from the memory. For each successive input word of the input stream, the processor determines whether the input word matches an entry in a lookback table. The processor updates the lookback table in response to the input word. The processor generates a codeword by entropy encoding a data type corresponding to the input word. Input words may be of a plurality of data types. The data types include at least a first data type that indicates matching between the input word and an entry in the lookback table and a second data type that indicates partial matching between the input word and an entry in the lookback table. The processor generates an output stream that includes the codewords.

An exemplary computer program product for compressing an input stream includes computer-executable logic embodied in a non-transitory storage medium. Execution of the logic by the processor configures the processor to, for each successive input word of the input stream, determine whether the input word matches an entry in a lookback table. The processor updates the lookback table in response to the input word. The processor generates a codeword by entropy encoding a data type corresponding to the input word. Input words may be of a plurality of data types. The data types include at least a first data type that indicates full matching between the input word and an entry in the lookback table and a second data type that indicates partial matching between the input word and an entry in the lookback table. The processor generates an output stream that includes the codewords.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

Figure 1:
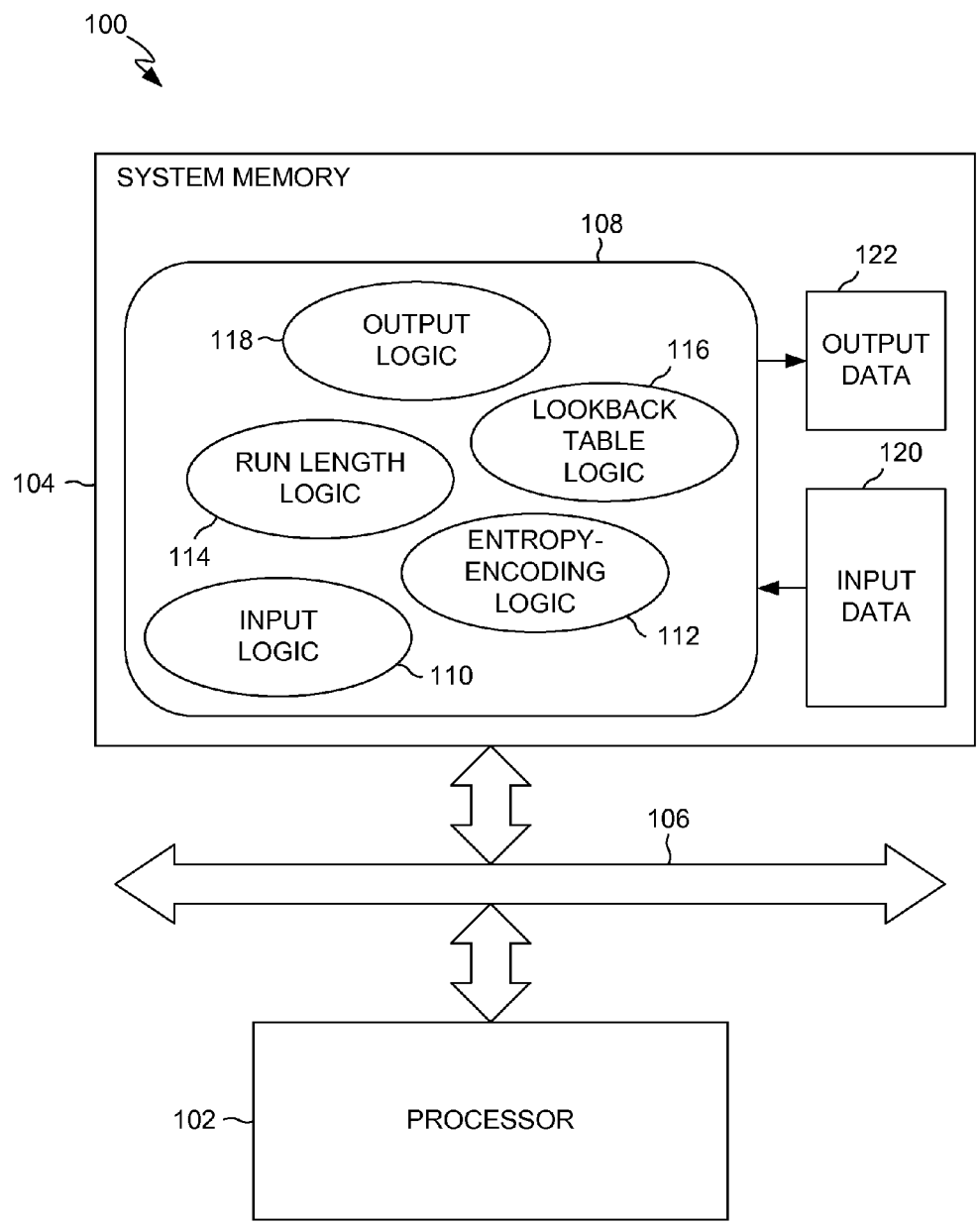
FIG. 1 is a block diagram of a processing system having a data compression feature.

The word "exemplary" is used herein to mean "serving as an example, instance, or illustration." Any aspect described herein as "exemplary" is not necessarily to be construed as preferred or advantageous over other aspects.

The terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes, such as in accordance with a signal having one or more data packets (e.g., data from one component interacting with another component in a local system, distributed system, and/or across a network such as the Internet with other systems by way of the signal).

The term "application" or "image" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

The term "task" may include a process, a thread, or any other unit of execution in a device. The term "method" and "process" may be used synonymously.

The term "virtual memory" refers to the abstraction of the actual physical memory from the application or image that is referencing the memory. A translation or mapping may be used to convert a virtual memory address to a physical memory address. The mapping may be as simple as 1-to-1 (e.g., physical address equals virtual address), moderately complex (e.g., a physical address equals a constant offset from the virtual address), or the mapping may be complex (e.g., every 4 KB page mapped uniquely). The mapping may be static (e.g., performed once at startup), or the mapping may be dynamic (e.g., continuously evolving as memory is allocated and freed).

In this description, the terms "communication device," "wireless device," "wireless telephone," "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

As illustrated in FIG. 1, in an exemplary embodiment a processing system 100 includes a processor 102 and a system memory 104. Processor 102 and system memory 104 may communicate signals with each other and with other devices (not shown in FIG. 1) via one or more interconnects 106, such as buses. In accordance with conventional computing principles, processor 102 operates under the control of programming code, such as operating system code and application program code (not shown for purposes of clarity), which configures processor 102 to perform various functions or methods. Such methods include the data compression methods described herein. Through such code, processor 102 may be configured with data compression logic 108 related to the data compression methods described herein. Data compression logic 108 may include: input logic 110, entropy-encoding logic 112, run-length logic 114, lookback table logic 116, and output logic 118. Although logic 108-118 is conceptually shown for purposes of illustration as stored or residing in system memory 104, it is understood that logic 108-118 arises through operation of software, which may be stored in system memory 104 or in another memory (not shown in FIG. 1). As programmed or configured with logic 108-118, the combination of processor 102 and system memory 104 generally defines a processing system 100 that is configured to perform the data compression methods described herein. Although not shown in FIG. 1 for purposes of clarity, in addition to being configured to perform the data compression methods described herein, processing system 100 may be configured to perform conventional methods, such as, for example, operating system methods and application program methods. It should also be noted that the combination of logic 108-118 or related software elements and the medium on which they are stored or in which they reside (e.g., system memory 104) in non-transitory form generally defines what is referred to in the patent lexicon as a "computer program product." Further, logic 108-118 defines means for performing the functions described below.

In accordance with the exemplary data compression methods described below, processing system 100 compresses input data 120 into output data 122. As understood by one of ordinary skill in the art, input data 120 exists in an "uncompressed" or native form that processor 102 may directly utilize, while output data 122 exists in a compressed form that cannot be directly utilized by processor 102 but which occupies less storage space in system memory 104 than input data 120. Although for purposes of illustrating an exemplary embodiment, input data 120 and output data 122 are conceptually shown as residing or stored in system memory 104, it should be understood that in other embodiments such input data and output data may reside in any other suitable storage or communications media. As described below with regard to the exemplary methods, input data 120 is received in the form of a stream of successive input words, and output data 122 is generated in the form of a stream of successive output words.

In an exemplary embodiment, input data 120 may be compressed into output data 122 in accordance with a compressed caching scheme. For example, one or more pages of input data 120 to which the caching scheme determines that processor 102 does not need immediate access may be compressed into output data 122, and the space in system memory 104 formerly occupied by those pages is made available for other uses. When the caching scheme indicates that one or more of those pages are needed again by processor 102, the compressed pages may be decompressed and stored again in uncompressed form in system memory 104. Although the terms "input" and "output" as used herein for purposes of clarity to refer to a compression method, it should be understood that the compressed data may serve as input to a corresponding decompression method. As such caching schemes are well understood in the art, caching aspects of the embodiments described herein are not described in further detail.

As described below, entropy coding, such as Huffman coding, is employed. Entropy coding is well understood by one of ordinary skill in the art and is therefore not described in detail herein. However, it should be recognized that prior to compressing input data, the relative frequencies of occurrence of different data types that are likely to occur in the input data may be determined. For example, as well understood in the art, a histogram may be constructed by analyzing a statistically significant sample of data. Codewords may then be assigned to the data types in a manner that inversely relates codeword length to frequency. That is, shorter codewords are assigned to higher-frequency data types, while longer codewords are assigned to lower-frequency data types. The data types that are encoded in the exemplary embodiment are described below.

The system describe below may be applied to other entropy coding schemes besides Huffman coding. The system may be applied to any type of dictionary-based coding. The system is applicable to any type of dictionary-based coding where a dictionary is built using patterns found in a data stream.

For example, the system may be applicable to other dictionary-based coding schemes such as incremental encoding. As understood by one of ordinary skill in the art, incremental encoding schemes may use suffixes or prefixes with its codewords to build its dictionary for the coding scheme. Such a coding scheme may also be referred to as a text-based, lossless coding scheme as understood by one of ordinary skill in the art. Other dictionary-based coding schemes that may be employed by the system include WKDM.

The system may also be employed by best performance methods which sample several dozen compression techniques before selecting a smaller set of compression technique to compress a data stream. Such lossless compression techniques are known in the art such as WinRAR and 7-Zip. The system may be employed in image compression tools such as those formats used to store Adobe™ images, like the portable document format (PDF), as well as lossy image compression techniques, such as Joint Photographic Experts Group (JPEG). The system may also be employed by lossless image compression techniques like Portable Network Graphics (PNG) compression.

Figure 2:
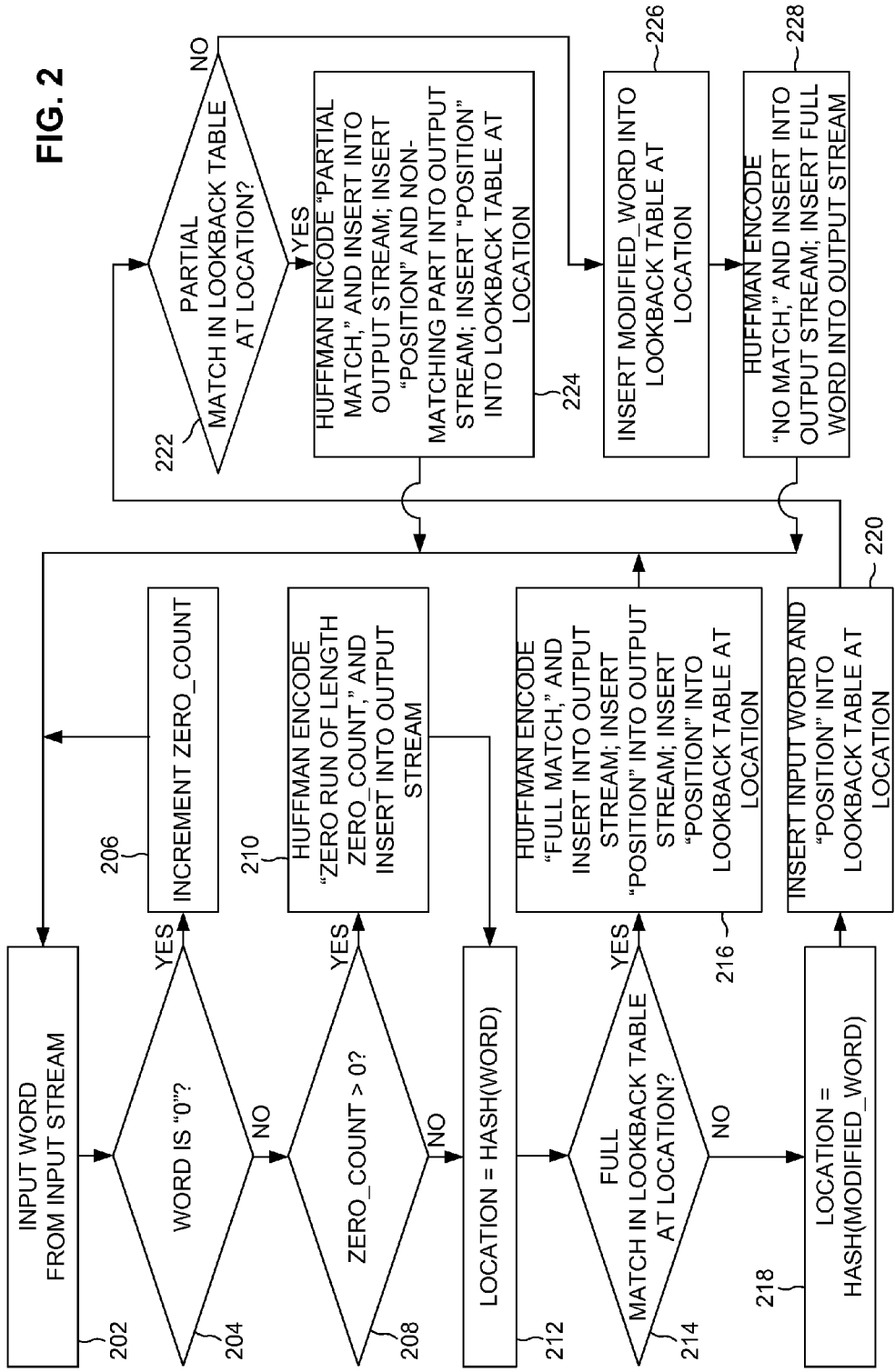
FIG. 2 is a flow diagram illustrating an exemplary method for compressing data.

As illustrated by the flow diagram of FIG. 2, in an exemplary embodiment the system described above with regard to FIG. 1 may compress an input stream. As indicated by block 202, the method begins with an input word being read from the input stream. The input logic 110 (FIG. 1) may contribute to this function and may include an input buffer (not shown).

As indicated by block 204, the method determines whether the input word has a value of zero, i.e., all bits are zero. An input word may consist of, for example, 16 bits, 32 bits, or any other suitable number of bits, as well understood by one of ordinary skill in the art. If it is determined that the input word has a value of zero, then a count ("ZERO_COUNT") of the number of successive input words similarly having zero values is incremented, as indicated by block 206. However, if it is determined that the input word does not have a value of zero, then it is determined whether ZERO_COUNT is greater than zero, as indicated by block 208. A determination that the input word does not have a value of zero but that ZERO_COUNT is greater than zero indicates that a zero run has occurred. That is, two or more successive input words have values of zero. If it is determined that a zero run occurred, then the input word is Huffman encoded to represent a zero run, as indicated by block 210. That is, a codeword is generated for a data type of a zero run of length ZERO_COUNT. The generated codeword becomes a portion of the output stream.

Figure 6A:
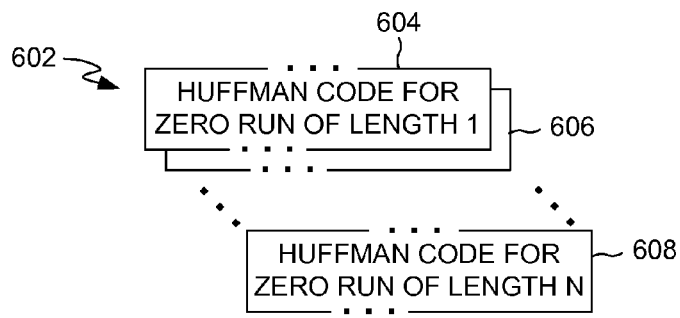
FIG. 6A is a data structure diagram illustrating a portion of an output stream comprising a codeword for a zero run.

As illustrated in FIG. 6A, a portion 602 of the output stream may be generated that comprises one of a number of generated codewords 606 through 608 for the data type of two or more successive input words having a value of zero. As indicated in FIG. 6A by the plurality of different codewords 604, 606, 608, etc., each run length ("ZERO_COUNT") is uniquely encoded. That is, in an embodiment in which it is determined that N different lengths of zero runs may occur in the input stream with a corresponding number N of different frequencies, codewords 604-608 may be N in number. For example, while codeword 604 may be generated for the data type of a single input word having a value of zero, codeword 606 may be generated for the data type of two consecutive or successive input words having a value of zero, etc., and codeword 608 may be generated for the data type of N consecutive or successive input words having a value of zero. Still other codewords that may be generated for data types of between three and N−1 consecutive or successive input words having a value of zero are not individually shown in FIG. 6A for purposes of clarity but are indicated by the ellipsis (" . . . ") symbols between codewords 606 and 608.

In accordance with well understood Huffman coding principles, a run of X number of successive zeros may be encoded by a shorter codeword than a run of Y number consecutive zeros if it is determined (e.g., by the histogram method or other suitable method as known in the art) that a run of X successive zeros is likely to occur more frequently in the input data than a run of Y successive zeros.

Figure 4:
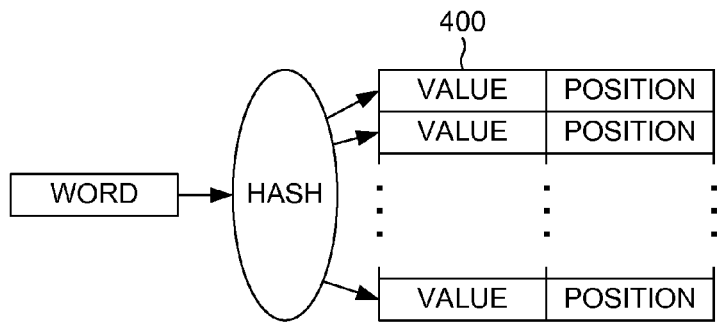
FIG. 4 is a conceptual diagram illustrating accessing a lookback table using a hash function.

The method continues with block 212. As indicated by block 212, a hash function is applied to the input word. Note that if a zero run was detected as described above with regard to block 208, the input word is that which follows the final zero-value input word of the zero run. As illustrated in FIG. 4, the result of applying the hash function is used to identify or address a location ("LOCATION") in a lookback table structure 400. Lookback table structure 400 is configured to store a value ("VALUE") and a position ("POSITION") at each location. In other words, each location in lookback table structure 400 references both a value and position. As described below, the position may be used to access the value in the corresponding location in lookback table structure 400. Lookback table structure 400 may have any number of locations, such as, for example, 2048 or 2 k. Such a lookback table structure 400 thus would be configured to store 2048 values and 2048 corresponding positions. Initially, i.e., upon beginning the compression (or decompression) method, there are no values or other entries stored in lookback table structure 400.

Referring again to FIG. 2, as indicated by block 214, it is determined whether there is a value stored at the identified location (i.e., LOCATION identified by the hash function) in lookback table structure 400 that matches the input word. The term "match" in the context of block 220 refers to a bit-wise match of all bits in the two words. This type of match may also be referred to as a full match.

Figure 6B:
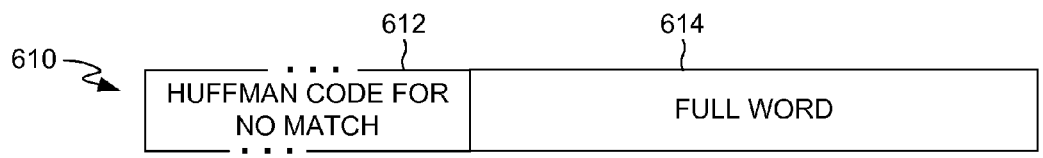
FIG. 6B is a data structure diagram illustrating a portion of an output stream comprising a codeword for no match and the non-matching full input word.
Figure 6C:
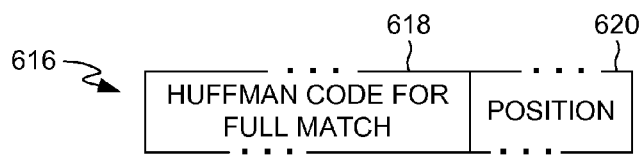
FIG. 6C is a data structure diagram illustrating a portion of an output stream comprising a codeword for a full match and the position of the matching word in the input stream.

If it is determined (block 214) that there is a full match between an input word and a value stored at the identified location in lookback table structure 400, then a codeword is generated for this data type (i.e., a full match), as indicated by block 216. In association with generating a codeword for an input word that is a full match, an indication of the position of the input word in the input stream ("POSITION") is included in the generated output. Accordingly, a portion 616 (FIG. 6C) of the output stream may be generated that comprises the generated codeword 618 for the data type of a fully matching input word as well as an indication of the position 620 of the input word in the input stream. The indication of the position of the input word in the input stream ("POSITION") is also inserted into lookback table structure 400 at the identified location. Following block 216, the method may return to block 202, where the next input word in the input stream is processed.

If it is determined (block 214) that there is no full match, then it is further determined whether there is a partial match. As indicated by block 218, a location ("LOCATION") is first determined by applying the hash function to a modified version of the input word. The modified version of the input word may be produced by manipulating the bits of the input word that are to be tested for a partial match. For example, in an embodiment in which each input word is 32 bits in length, and in which a partial match is defined as a bit-wise match of the 12 upper or most-significant bits ("MSBs") of the input word and a value stored at the identified location in lookback table structure 400, the modified word ("MODIFIED_WORD") may be produced by masking off the 12 MSBs of the input word and shifting by 20 bits to place the 12 relevant bits in the least-significant bit ("LSB") positions. Then, as indicated by block 220, an indication of the position of the input word in the input stream ("POSITION") is inserted into lookback table structure 400 at the identified location ("LOCATION").

Figure 6D:
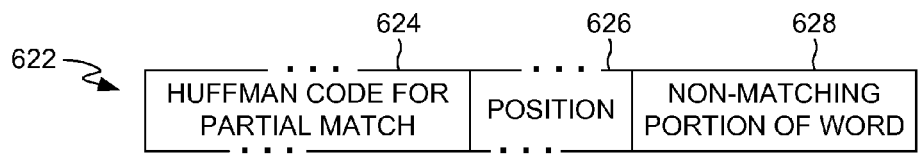
FIG. 6D is a data structure diagram illustrating a portion of an output stream comprising a codeword for a partial match, the position of the partially matching word in the input stream, and the non-matching portion of the input word.

As indicated by block 222, it is determined whether there is a partial match by comparing a portion or subset of adjacent or contiguous bits of the input word match with the corresponding bits of the value stored at the identified location ("LOCATION") in lookback table structure 400. If it is determined (block 222) that there is a partial match between an input word and a value stored at the identified location in lookback table structure 400, then a codeword is generated for this data type (i.e., a partial match), as indicated by block 224. In association with generating a codeword for an input word that is a partial match, an indication of the position of the input word in the input stream ("POSITION") is included in the generated output. The non-matching portion of the input word is also included in the generated output. Accordingly, a portion 622 (FIG. 6D) of the output stream may be generated that comprises: the generated codeword 624 for the data type of a partially matching input word; an indication of the position 626 of the input word in the input stream; and the non-matching portion 628 of the input word. For example, in an embodiment in which an input word consists of 32 bits, and a partial match is defined as a match of the 12 MSBs, then the non-matching portion 628 of the input word would consist of the 20 least-significant bits (LSBs). The indication of the position of the input word in the input stream ("POSITION") is also inserted into lookback table structure 400 at the identified location. Following block 224, the method may return to block 202, where the next input word in the input stream is processed.

If it is determined in accordance with blocks 214 and 222, respectively, that the input word neither fully nor partially matches any entry in lookback table structure 400, then the modified word ("MODIFIED_WORD") is added to (i.e., stored at the identified location in) lookback table structure 400, as indicated by block 226. As indicated by block 228, a codeword is generated for this data type (i.e., neither a full nor partial match) in accordance with the Huffman coding scheme in the exemplary embodiment. In association with generating a codeword for an input word that is neither a full nor partial match, the entire non-matching input word itself (which may also be referred to as the "raw" input word) is included in the generated output. Accordingly, a portion 610 (FIG. 6B) of the output stream may be generated that comprises the generated codeword 612 for the data type of a non-matching input word as well as a copy or instance of the input word 614. Following block 208, the method may return to block 202, where the next input word in the input stream is processed. Although not shown in FIG. 2 for purposes of clarity, the method may terminate when all input words in the input stream have been processed. The input stream may represent one or more pages of input data 120 (FIG. 1).

Figure 5:
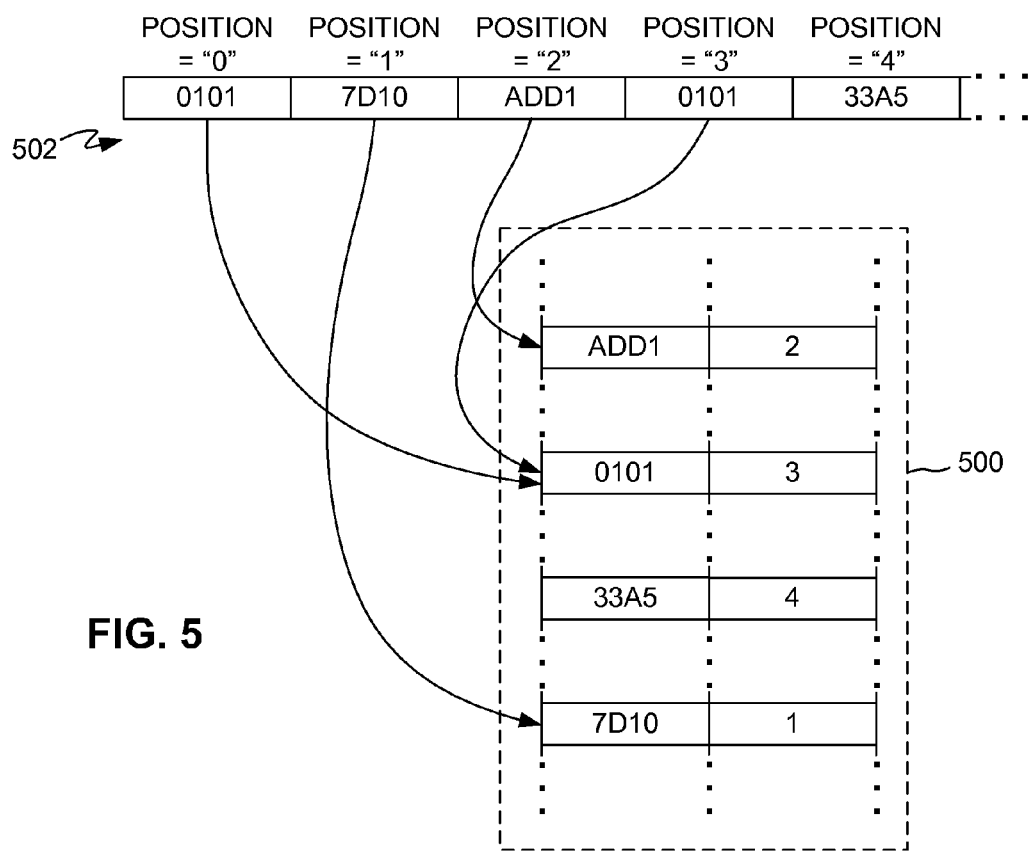
FIG. 5 is a conceptual diagram illustrating indexing lookback table entries by input word position in the input stream.

Referring briefly to FIG. 5, an exemplary portion 502 of the input stream is depicted as having successive input words (in hexadecimal notation) 0101, 7D10, ADD1, 0101, 33A5, etc. (These input word values have no significance, i.e., are arbitrary, and serve only for purposes of illustration in this example. Also, although depicted as 16-bit words for convenience of illustration, these input words may be 32 bits.) Also shown in FIG. 5 is an exemplary lookback table 500 having the same structure described above with regard to lookback table structure 400 (FIG. 4).

Thus, for example, exemplary lookback table 500 may be configured to store 2048 values and 2048 corresponding positions. In this example, the input word 0101 is located in position 0 in the input stream. Accordingly, in an instance in which it is determined (blocks 214 and 222) that the input word 0101 is neither a full nor partial match, then the input word 0101 and its position 0 would be stored in the location in exemplary lookback table 500 determined by application of the above-referenced hash function to the input word 0101. Likewise in this example, in an instance in which it is determined (blocks 214 and 222) that the input word 7D10 is neither a full nor partial match, then the input word 7D10 and its position 1 would be stored in the location in exemplary lookback table 500 determined by application of the above-referenced hash function to the input word 7D10.

Similarly in this example, in an instance in which it is determined (blocks 214 and 222) that the input word ADD1 is neither a full nor partial match, then the input word ADD1 and its position 2 would be stored in the location in exemplary lookback table 500 determined by application of the above-referenced hash function to the input word ADD1. However, in this example the result of processing the input word 0101 in position 3 is a full match with the value stored in the location in exemplary lookback table 500 that is indexed by "3". As described above, the positions stored in lookback table structure 400 may be used to index or access the values in the corresponding locations in lookback table structure 400. In this example, using the position "3" of the input word 0101 to access the value stored at the corresponding location in exemplary lookback table 500 reveals that the value stored at that location is 0101. Comparing the value 0101 stored at that location with the input word 0101 in position 3 reveals a full match. Relative to conventional compression techniques, this inventive method and system replaces hash indexes with lookback positions.

Note that the indication of the position 620 or 626 (FIGS. 6C and 6D) of the input word may also be referred to as an output index because it forms part of the generated output stream and it indexes or points to a value stored in lookback table structure 400. The output index in the output stream corresponds to the position that lookback table structure 400 is configured to store. As each position stored in lookback table structure 400 indexes or corresponds to a value stored in lookback table structure 400, the output index may be used to access the corresponding value stored in lookback table structure 400.

The output index may be represented economically in the output stream using the base-2 logarithm of the position in the input stream of the relevant input word. As the method keeps track of the position in the input stream of each input word as it is processed, the method need not represent the output index by more than the fewest bits by which a binary number of the magnitude represented by the position in the input stream could be represented. For example, an output index of 3 need not be represented by more than two bits in the output stream because the method cannot generate such an output index when processing input words beyond position 3 in the input stream. Taking the base-2 logarithm of 3 yields approximately 1.5, and applying a ceiling function to that result yields 2.

Thus, it can be determined that any position in the input stream less than 3 can be represented with as few as two bits. Likewise, for example, an output index of 15 need not be represented by more than four bits in the output stream because the method cannot generate such an output index when processing the input words beyond position 15 in the input stream. Taking the base-2 logarithm of 15 yields approximately 3.9, and applying a ceiling function to that result yields 4. Thus, it can be determined that any position in the input stream less than 15 can be represented with as few as four bits.

The hash index replacement with lookback positions technique may be employed by any dictionary-based coding used in data compression techniques. Exemplary dictionary-based coding methods include, but are not limited to, WKDM, incremental encoding, and Lempel-Ziv based methods, such as, LZ78, LZW, LZ77, LZMS, LZO, LZS, and LZRW, just to name a few. The replacement of hash indexes with lookback positions may also be useful in other compression techniques for images, such as Fractal compression. As understood by one of ordinary skill in the art, Fractal compression techniques usually divide an image into several sub-sections and the technique determines if sub-sections may be copied relative to each other if a first sub-sections of an image looks fairly similar to second and third sub-sections of an image, etc. etc.

Because the replacement of hash indexes with lookback positions can eliminate the number of data structures requiring access by a processor, this can increase the speed at which a datastream can be decompressed since there are less data structures to access/review in order to decompress the data stream. Another advantage of the inventive method and system is that the dictionary of lookback positions (instead of hash indexes) may be infinitely large in size compared to dictionaries which may only store hash indexes. Another advantage of a dictionary of lookback positions instead of hash indexes is that it may reduce or eliminate hash collisions since hashes are no longer employed in the dictionary.

With the inventive method and system, each lookback table entry which comprises a lookback position may have a size which is a function of the length of the data stream. For example, for the first word of a data stream, the lookback entry for this single word may comprise a pointer having a value of zero (a single bit in size). For the second word of the datastream, the lookback position entry (or pointer) length may comprise a value of one (a single bit in size). For a four kilobyte length data stream, the lookback entry (pointer length) for the last word may comprise a pointer length having a value of twelve bits. Thus, the pointer length of the inventive method and system gradually increases the data stream is encoded using lookback positions (instead of hash indexes).

Figure 3:
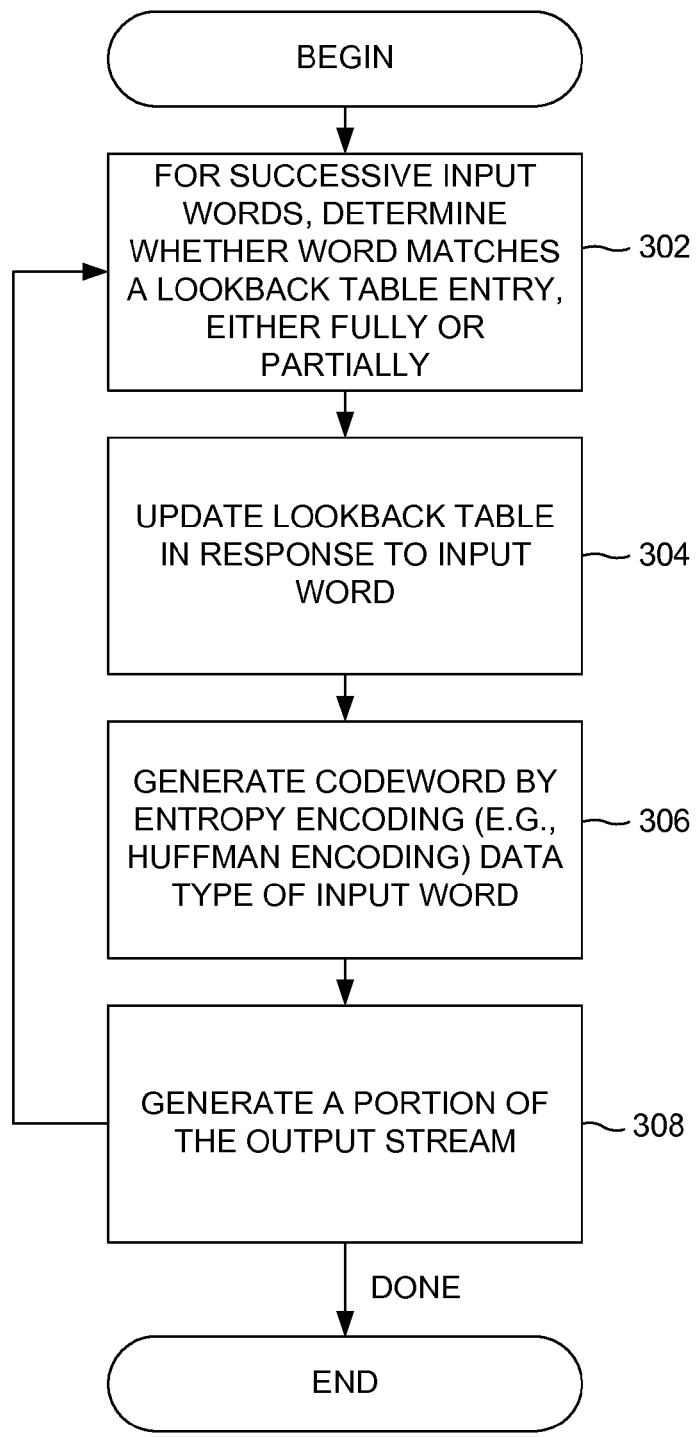
FIG. 3 is another flow diagram illustrating an exemplary method for compressing data.

As illustrated in FIG. 3, the above-described method may also be characterized in the following higher-level manner. As indicated by block 302, for successive input words in the input stream, it is determined whether the input word matches a lookback table entry, either fully or partially. As indicated by block 304, the lookback table is updated in response to the input word. As indicated by block 306, using entropy encoding, a codeword is generated for whichever data type the input word is determined to be. Although in the exemplary embodiment the entropy coding scheme is Huffman coding, in other embodiments such an entropy coding scheme may be of any other type. There may be two or more data types, at least one of which indicates full matching between input words and lookback table entries and another of which indicates partial matching between input words and lookback table entries. In the exemplary embodiment described above with regard to FIG. 2, there are four primary data types: zero run (and sub-types of this data type may indicate different length zero runs); full match; partial match; and no match. As indicated by block 308, an output stream is generated. Each successive portion of the output stream includes a codeword corresponding to one of the successive input words in the input stream and may also include additional information, such as an output index, a full word, or a portion of a word, as described above with regard to FIGS. 6A-6D.

In view of the foregoing description of an exemplary compression method, one of ordinary skill in the art will readily appreciate the corresponding decompression method. Each successive portion of the compressed data includes a codeword corresponding to one of the successive input words in the input stream and may also include, in association with the codeword, an output index, a full word, or a portion of a word. In response to detection of a codeword for a zero run, the decompression method outputs as decompressed data a consecutive number of zero-value words indicated by the codeword. In response to detection of a codeword for no match, the decompression method outputs as decompressed data the word that is present in the compressed data in association with that codeword. In response to detection of a codeword for a full match, the decompression method uses the output index that is present in the compressed data in association with that codeword to retrieve a lookback table entry, which the decompression method then outputs as decompressed data. In response to detection of a codeword for a partial match, the decompression method uses the output index that is present in the compressed data in association with that codeword to retrieve a lookback table entry, which the decompression method then outputs in conjunction with the partial word that is present in the compressed data in association with that codeword. For example, in an embodiment in which an input word consists of 32 bits, a decompression method may append a partial word representing 10 LSBs to 22 MSBs retrieved from the lookback table entry to form the decompressed output.

Figure 7:
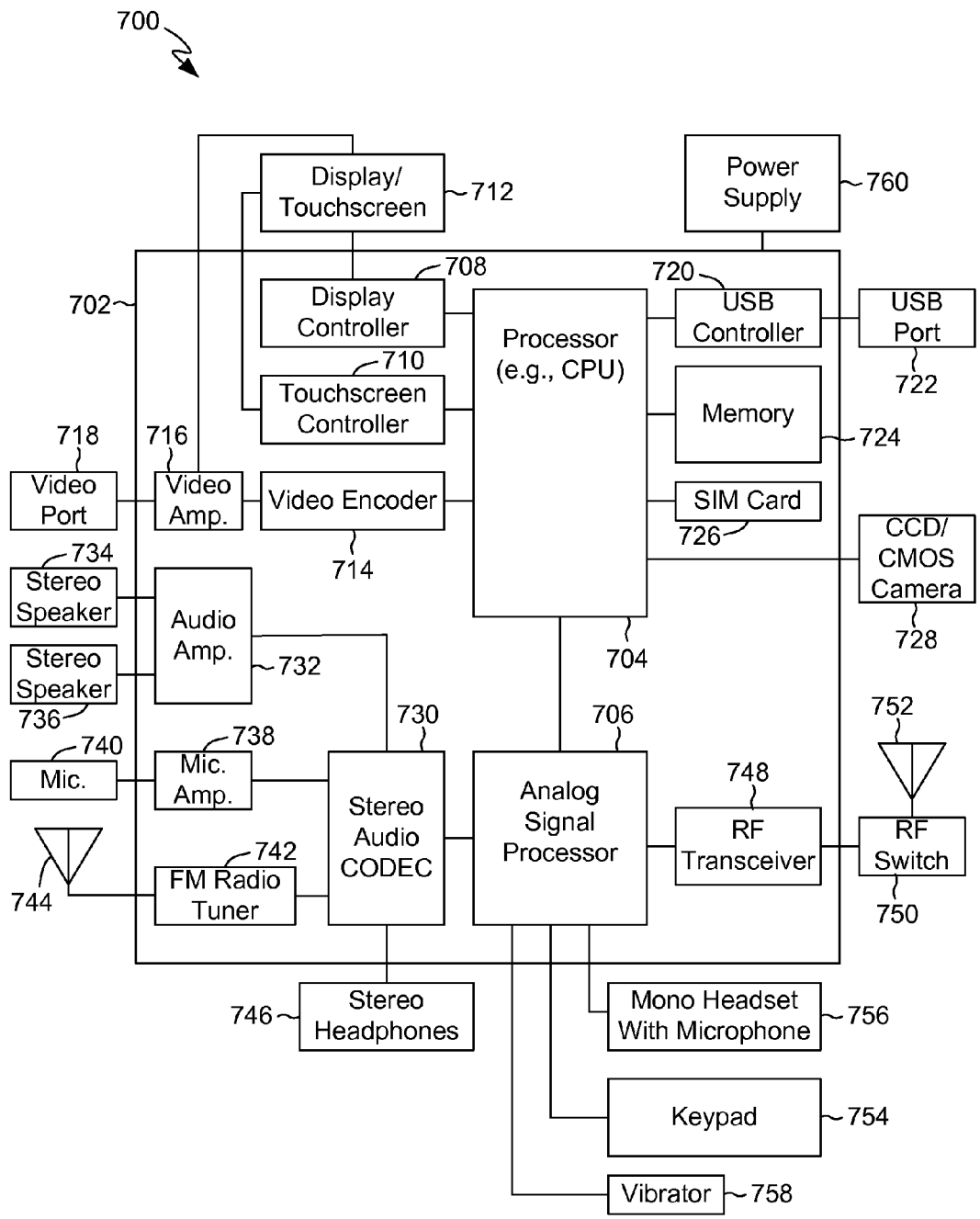
FIG. 7 is a block diagram of a portable computing device having one or more processing systems with data compression features.

Processing system 100 (FIG. 1) may represent or be included in any suitable type of device, such as, for example, the portable communication device 700 illustrated in FIG. 7. Portable communication device 700 includes an on-chip system 702 that includes a central processing unit ("CPU") 704. An analog signal processor 706 is coupled to CPU 704. CPU 704 may be configured to operate in the manner described above with respect to the above-described compression and caching methods. A display controller 708 and a touchscreen controller 710 are coupled to the CPU 704. A touchscreen display 712 external to the on-chip system 702 is coupled to the display controller 708 and the touchscreen controller 710. A video encoder 714, e.g., a phase-alternating line ("PAL") encoder, a sequential couleur avec memoire ("SECAM") encoder, a national television system(s) committee ("NTSC") encoder or any other video encoder, is coupled to CPU 704. Further, a video amplifier 716 is coupled to the video encoder 714 and the touchscreen display 712. A video port 718 is coupled to the video amplifier 716. A USB controller 720 is coupled to CPU 704. A USB port 722 is coupled to the USB controller 720. A memory 724, which may operate in the manner described above with regard to memory 104 (FIG. 1), is coupled to CPU 704. A subscriber identity module ("SIM") card 726 and a digital camera 728 also may be coupled to CPU 704. In an exemplary aspect, the digital camera 728 is a charge-coupled device ("CCD") camera or a complementary metal-oxide semiconductor ("CMOS") camera.

A stereo audio CODEC 730 may be coupled to the analog signal processor 706. Also, an audio amplifier 732 may be coupled to the stereo audio CODEC 730. In an exemplary aspect, a first stereo speaker 734 and a second stereo speaker 736 are coupled to the audio amplifier 732. In addition, a microphone amplifier 738 may be coupled to the stereo audio CODEC 730. A microphone 740 may be coupled to the microphone amplifier 738. In a particular aspect, a frequency modulation ("FM") radio tuner 742 may be coupled to the stereo audio CODEC 730. Also, an FM antenna 744 is coupled to the FM radio tuner 742. Further, stereo headphones 746 may be coupled to the stereo audio CODEC 730.

A radio frequency ("RF") transceiver 748 may be coupled to the analog signal processor 706. An RF switch 750 may be coupled between the RF transceiver 748 and an RF antenna 752. The RF transceiver 748 may be configured to communicate with conventional terrestrial communications networks, such as mobile telephone networks, as well as with global positioning system ("GPS") satellites.

A mono headset with a microphone 756 may be coupled to the analog signal processor 706. Further, a vibrator device 758 may be coupled to the analog signal processor 706. A power supply 760 may be coupled to the on-chip system 702. In a particular aspect, the power supply 760 is a direct current ("DC") power supply that provides power to the various components of the portable communication device 700 that require power. Further, in a particular aspect, the power supply is a rechargeable DC battery or a DC power supply that is derived from an alternating current ("AC") to DC transformer that is connected to an AC power source.

A keypad 754 may be coupled to the analog signal processor 706. The touchscreen display 712, the video port 718, the USB port 822, the camera 728, the first stereo speaker 734, the second stereo speaker 736, the microphone 740, the FM antenna 744, the stereo headphones 746, the RF switch 750, the RF antenna 752, the keypad 754, the mono headset 756, the vibrator 758, and the power supply 760 are external to the on-chip system 702.

The method steps described herein (such as described above with regard to FIGS. 2 and 3) may be stored in memory 724 in the form of computer program instructions. These instructions may be executed by CPU 704 or another processor to perform the methods described herein.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for compressing an input stream of a plurality of input words, the method comprising:
for each successive input word of the input stream, determining whether the input word matches an entry in a lookback table, the lookback table storing a plurality of entries;
updating the lookback table in response to the input word;
generating a codeword by entropy encoding a data type corresponding to the input word, each input word being one of a plurality of data types, the plurality of data types including at least a first data type indicating full matching between the input word and an entry in the lookback table and a second data type indicating partial matching between the input word and an entry in the lookback table; and
generating an output stream, the output stream including codewords ordered correspondingly to the input words of the input stream.

2. The method of claim 1, wherein the plurality of data types includes a plurality of third data types, each third data type indicating a run length of a unique number of zeros, and each of a plurality of run lengths is encoded as a different codeword.

3. The method of claim 1, wherein the plurality of data types includes a fourth data type indicating neither full nor partial matching between the input word and an entry in the lookback table.

4. The method of claim 1, wherein:
updating in the lookback table comprises storing a table index for the input word in the lookback table, the table index representing a position of the input word in the input stream; and
generating an output stream comprises generating an output index associated with each codeword generated for an input word of the first data type, the output index representing a position of a fully matching input word in the input stream.

5. The method of claim 4, wherein the output index is represented in the compressed output by a number of bits determined in response to a base-2 logarithm of a position of the input word in the input stream.

6. The method of claim 1, wherein partial matching between the input word and an entry in the lookback table comprises bit-wise matching of a subset of contiguous bits of the input word and a correspondingly positioned subset of contiguous bits of the entry in the lookback table.

7. The method of claim 1, wherein:
- updating the lookback table comprises storing a table index for the input word in the lookback table, the table index representing a position of the input word in the input stream; and
- generating an output stream comprises generating a non-matching word portion in association with each codeword generated for an input word of the second data type and generating an output index in association with each codeword generated for an input word of the second data type, the output index representing a position of a partially matching input word in the input stream.

8. The method of claim 7, wherein the output index is represented in the compressed output by a number of bits determined in response to a base-2 logarithm of a position of the input word in the input stream.

9. The method of claim 1, wherein full matching between an input word and an entry in the lookback table comprises bit-wise matching of all bits of the input word and all bits of the entry in the lookback table.

10. The method of claim 1, wherein:
- updating the lookback table comprises storing a table index for the input word in the lookback table, the table index representing a position of the input word in the input stream;
- the plurality of data types includes a fourth data type indicating neither full nor partial matching between the input word and an entry in the lookback table; and
- generating an output stream comprises generating a non-matching full word in association with each codeword generated for an input word of the fourth data type.

11. A system for compressing an input stream of a plurality of input words, comprising:
- a memory; and
- a processor configured to perform a method comprising reading successive input words of the input stream from the memory and, for each successive input word:
    - determining whether the input word matches an entry in a lookback table, the lookback table storing a plurality of entries;
    - updating the lookback table in response to the input word;
    - generating a codeword by entropy encoding a data type corresponding to the input word, each input word being one of a plurality of data types, the plurality of data types including at least a first data type indicating full matching between the input word and an entry in the lookback table and a second data type indicating partial matching between the input word and an entry in the lookback table; and
    - generating an output stream, the output stream including codewords ordered correspondingly to the input words of the input stream.

12. The system of claim 11, wherein the plurality of data types includes a plurality of third data types, each third data type indicating a run length of a unique number of zeros, and each of a plurality of run lengths is encoded as a different codeword.

13. The system of claim 11, wherein the plurality of data types includes a fourth data type indicating neither full nor partial matching between the input word and an entry in the lookback table.

14. The system of claim 11, wherein:
- updating the lookback table comprises storing a table index for the input word in the lookback table, the table index representing a position of the input word in the input stream; and
- generating an output stream comprises generating an output index associated with each codeword generated for an input word of the first data type, the output index representing a position of a fully matching input word in the input stream.

15. The system of claim 14, wherein the output index is represented in the compressed output by a number of bits determined in response to a base-2 logarithm of a position of the input word in the input stream.

16. The system of claim 11, wherein partial matching between the input word and an entry in the lookback table comprises bit-wise matching of a subset of contiguous bits of the input word and a correspondingly positioned subset of contiguous bits of the entry in the lookback table.

17. The system of claim 11, wherein:
- updating the lookback table comprises storing a table index for the input word in the lookback table, the table index representing a position of the input word in the input stream; and
- generating an output stream comprises generating a non-matching word portion in association with each codeword generated for an input word of the second data type and generating an output index in association with each codeword generated for an input word of the second data type, the output index representing a position of a partially matching input word in the input stream.

18. The system of claim 17, wherein the output index is represented in the compressed output by a number of bits determined in response to a base-2 logarithm of a position of the input word in the input stream.

19. The system of claim 11, wherein full matching between an input word and an entry in the lookback table comprises bit-wise matching of all bits of the input word and all bits of the entry in the lookback table.

20. The system of claim 11, wherein:
- updating the lookback table comprises storing a table index for the input word in the lookback table, the table index representing a position of the input word in the input stream;
- the plurality of data types includes a fourth data type indicating neither full nor partial matching between the input word and an entry in the lookback table; and
- generating an output stream comprises generating a non-matching full word in association with each codeword generated for an input word of the data type.

21. A computer program product for compressing an input stream of a plurality of input words, the computer program product comprising a non-transitory computer readable medium having computer executable logic stored thereon, the computer executable logic comprising:
- input logic configured to, for each successive input word of the input stream, determine whether the input word matches an entry in a lookback table, the lookback table storing a plurality of entries;
- lookback table logic configured to update the lookback table in response to the input word;
- entropy encoding logic configured to generate a codeword by entropy encoding a data type corresponding to the input word, each input word being one of a plurality of data types, the plurality of data types including at least a first data type indicating full matching between the input word and an entry in the lookback table and a second data type indicating partial matching between the input word and an entry in the lookback table; and
- output logic configured to generate an output stream, the output stream including codewords ordered correspondingly to the input words of the input stream.

22. The computer program product of claim 21, wherein the plurality of data types includes a plurality of third data types, each third data type indicating a run length of a unique number of zeros, and each of a plurality of run lengths is encoded as a different codeword.

23. The computer program product of claim 21, wherein:
the lookback table logic is configured to store a table index for the input word in the lookback table, the table index representing a position of the input word in the input stream; and
the output logic is configured to generate an output index associated with each codeword generated for an input word of the first data type, the output index representing a position of a fully matching input word in the input stream.

24. The computer program product of claim 23, wherein the output index is represented in the compressed output by a number of bits determined in response to a base-2 logarithm of a position of the input word in the input stream.

25. The computer program product of claim 21, wherein partial matching between the input word and an entry in the lookback table comprises bit-wise matching of a subset of contiguous bits of the input word and a correspondingly positioned subset of contiguous bits of the entry in the lookback table.

26. The computer program product of claim 21, wherein:
updating the lookback table comprises storing a table index for the input word in the lookback table, the table index representing a position of the input word in the input stream; and
the output logic is configured to generate a non-matching word portion in association with each codeword generated for an input word of the second data type and generate an output index in association with each codeword generated for an input word of the second data type, the output index representing a position of a partially matching input word in the input stream.

27. The computer program product of claim 26, wherein the output index is represented in the compressed output by a number of bits determined in response to a base-2 logarithm of a position of the input word in the input stream.

28. The computer program product of claim 21, wherein:
the lookback table logic is configured to store a table index for the input word in the lookback table, the table index representing a position of the input word in the input stream;
the plurality of data types includes a fourth data type indicating neither full nor partial matching between the input word and an entry in the lookback table; and
generating an output stream comprises generating a non-matching full word in association with each codeword generated for an input word of the fourth data type.

29. A system for compressing an input stream of a plurality of input words, the system comprising:
means for determining, for each successive input word of the input stream, whether the input word matches an entry in a lookback table, the lookback table storing a plurality of entries;
means for updating the lookback table in response to the input word;
means for generating a codeword by entropy encoding a data type corresponding to the input word, each input word being one of a plurality of data types, the plurality of data types including at least a first data type indicating full matching between the input word and an entry in the lookback table and a second data type indicating partial matching between the input word and an entry in the lookback table; and
means for generating an output stream, the output stream including codewords ordered correspondingly to the input words of the input stream.

30. The system of claim 29, wherein the plurality of data types includes a plurality of third data types, each third data type indicating a run length of a unique number of zeros, and each of a plurality of run lengths is encoded as a different codeword.

* * * * *